(12) United States Patent
Bai

(10) Patent No.: US 12,495,701 B2
(45) Date of Patent: Dec. 9, 2025

(54) DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventor: Wei Bai, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/792,722

(22) PCT Filed: May 31, 2022

(86) PCT No.: PCT/CN2022/096454
§ 371 (c)(1),
(2) Date: Jul. 14, 2022

(87) PCT Pub. No.: WO2023/226069
PCT Pub. Date: Nov. 30, 2023

(65) Prior Publication Data
US 2025/0089525 A1   Mar. 13, 2025

(30) Foreign Application Priority Data
May 25, 2022  (CN) .......................... 202210578771.3

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC .. H10K 59/873; H10K 59/1201; H10K 50/80; H10K 59/00; H10K 59/874;
(Continued)

(56) References Cited

U.S. PATENT DOCUMENTS

2018/0040851 A1   2/2018 Sasaki
2019/0036078 A1*  1/2019 Niiyama ............. H10K 50/846
(Continued)

FOREIGN PATENT DOCUMENTS

CN    208819914 U    5/2019
CN    110875440 A    3/2020
(Continued)

OTHER PUBLICATIONS

International Search Report in International application No. PCT/CN2022/096454, mailed on Nov. 28, 2022.
(Continued)

*Primary Examiner* — Elmito Breval
(74) *Attorney, Agent, or Firm* — Nathan & Associates Patent Agents Ltd.; Menachem Nathan

(57) ABSTRACT

A display panel and a manufacturing method thereof are provided. The display panel includes a functional area, a transition area defined at a periphery of the functional area, and a display area defined at a periphery of the transition area. The display panel further includes a substrate, at least one first groove is defined on the substrate in the transition area, and a first organic material layer is disposed in a first undercut area and/or a second undercut area in the first groove. The display panel of an embodiment of the present application has better encapsulation reliability and longer product service life.

17 Claims, 7 Drawing Sheets

(58) Field of Classification Search
CPC ............. H10K 59/122; H10K 50/8426; H10K 59/124; Y02P 70/50
See application file for complete search history.

(56) References Cited

U.S. PATENT DOCUMENTS

2020/0127233 A1* 4/2020 Sung .................... H10K 59/122
2021/0066651 A1* 3/2021 Kishimoto ......... H10K 59/8731

FOREIGN PATENT DOCUMENTS

| CN | 111129346 A | 5/2020 |
| CN | 113013359 A | 6/2021 |
| CN | 113690251 A | 11/2021 |
| CN | 113823668 A | 12/2021 |
| CN | 114464754 A | 5/2022 |
| KR | 20200090595 A | 7/2020 |

OTHER PUBLICATIONS

Written Opinion of the International Search Authority in International application No. PCT/CN2022/096454, mailed on Nov. 28, 2022.
Chinese Office Action issued in corresponding Chinese Patent Application No. 202210578771.3 dated Apr. 16, 2025, pp. 1-7.

* cited by examiner providing a substrate, wherein the substrate comprises a functional area, a transition area defined at a periphery of the functional area, and a display area defined at a periphery of the transition area; at least one first groove is defined on the substrate in the transition area, the first groove comprises a first portion close to an opening of the first groove and a second portion close to a bottom of the first groove, the first portion comprises a first side disposed close to the display area and a second side close to the functional area, the second portion comprises a first undercut area extending from the first side toward the display area and a second undercut area extending from the second side toward the functional area; ⸺ S100 forming a display functional layer on the substrate; ⸺ S200 forming a first inorganic barrier layer on the substrate and the display functional layer, wherein the first inorganic barrier layer covers a sidewall and the bottom of the first groove; ⸺ S300 forming a first organic material layer on a portion of the first inorganic barrier layer in the first groove, wherein the first organic material layer is distributed in at least one of the first undercut area or the second undercut area; and ⸺ S400 forming a second inorganic barrier layer on the first organic material layer, wherein at the first groove, the second inorganic barrier layer covers the first organic material layer and the first inorganic barrier layer. ⸺ S500

FIG. 4

DISPLAY PANEL AND MANUFACTURING METHOD THEREOF

BACKGROUND OF INVENTION

Field of Invention

The present application relates to the field of display, and in particular, to a display panel and a manufacturing method thereof.

Description of Prior Art

Organic light-emitting diode (OLED) display devices are widely used due to their advantages of self-luminescence, fast response time, wide viewing angles, and flexible display.

In order to realize a narrow frame design of the OLED display panel and improve a screen ratio, an existing technical solution is to dig a hole in the display screen of the OLED display panel to form an O-shaped through hole (O-cut), and set a component such as a camera, etc. under the O-shaped through hole. In order to prevent the OLED light-emitting material layer from forming a water vapor intrusion channel and causing encapsulation failure of the display area, a plurality of grooves are usually defined at a periphery of the O-shaped through hole, with an undercut structure (undercut) at the bottom end of the grooves. When the OLED device is encapsulated, multiple layers of inorganic barrier layers are usually deposited continuously on a sidewall and a bottom of the groove, and the multiple layers of inorganic barrier layers all cover an inner surface of the undercut structure. The inner surface is bent, so that a portion of the multiple layers of inorganic barrier layers on the inner surface of the undercut structure is prone to stress concentration and fracture when subjected to stress (such as bending or stretching), resulting in encapsulation failure. At the same time, the OLED display panel is vulnerable to water and oxygen intrusion, resulting in a shortened product service life.

SUMMARY OF INVENTION

Embodiments of the present application provide a display panel and a manufacturing method thereof. The display panel has high encapsulation reliability and long product service life.

In a first aspect, an embodiment of the present application provides a display panel, which includes a functional area, a transition area defined at a periphery of the functional area, and a display area defined at a periphery of the transition area;
wherein the display panel further includes a substrate, at least one first groove is defined on the substrate in the transition area, the first groove includes a first portion close to an opening of the first groove and a second portion close to a bottom of the first groove, the first portion includes a first side disposed close to the display area and a second side close to the functional area, the second portion includes a first undercut area extending from the first side toward the display area and a second undercut area extending from the second side toward the functional area, a first inorganic barrier layer, a first organic material layer, and a second inorganic barrier layer are stacked in the first groove in sequence, wherein the first inorganic barrier layer covers a sidewall and the bottom of the first groove, the first organic material layer is distributed in at least one of the first undercut area or the second undercut area, and the second inorganic barrier layer covers the first organic material layer and the first inorganic barrier layer.

In some embodiments, the first organic material layer includes a first organic layer and a second organic layer, the first organic layer is disposed in the first undercut area, and the second organic layer is disposed in the second undercut area, and the first organic layer and the second organic layer are not connected to each other.

In some embodiments, a material of the first organic material layer includes an organic material and a water absorbing material and/or a water blocking material dispersed in the organic material.

In some embodiments, the water-absorbing material includes at least one of calcium oxide or silica gel, and the water blocking material includes at least one of silicon oxide, silicon nitride, or silicon oxynitride.

In some embodiments, in the first organic material layer, the water absorbing material and/or the water blocking material has a mass percentage of 0.1 wt % to 30 wt %.

In some embodiments, each of a particle size of the water absorbing material and a particle size of the water blocking material ranges from 10 nm to 10 μm.

In some embodiments, at least one retaining wall is further disposed on the substrate in the transition area, and the retaining wall is arranged at a side of one of the at least one first groove closest to the display area facing the display area.

In some embodiments, at least one second groove is further defined on the substrate in the transition area, and the second groove is arranged at a side of one of the at least one retaining wall closest to the display area facing the display area, and one end of the second groove close to a bottom of the second groove includes a third undercut area extending toward the display area and a fourth undercut area extending toward the functional area.

In some embodiments, an organic material is provided in the second groove.

In some embodiments, a material of each of the first inorganic barrier layer and the second inorganic barrier layer includes one or more of silicon oxide, silicon nitride, and silicon oxynitride.

In a second aspect, an embodiment of the present application provides a method of manufacturing a display panel, including:
providing a substrate, wherein the substrate includes a functional area, a transition area defined at a periphery of the functional area, and a display area defined at a periphery of the transition area; at least one first groove is defined on the substrate in the transition area, the first groove includes a first portion close to an opening of the first groove and a second portion close to a bottom of the first groove, the first portion includes a first side disposed close to the display area and a second side close to the functional area, the second portion includes a first undercut area extending from the first side toward the display area and a second undercut area extending from the second side toward the functional area;
forming a display functional layer on the substrate;
forming a first inorganic barrier layer on the substrate and the display functional layer, wherein the first inorganic barrier layer covers a sidewall and the bottom of the first groove;

forming a first organic material layer on a portion of the first inorganic barrier layer in the first groove, wherein the first organic material layer is distributed in at least one of the first undercut area or the second undercut area; and forming a second inorganic barrier layer on the first organic material layer, wherein at the first groove, the second inorganic barrier layer covers the first organic material layer and the first inorganic barrier layer.

In some embodiments, before, after, or at the same time as the step of forming a first organic material layer on a portion of the first inorganic barrier layer corresponding to the transition area, the method further includes forming a second organic material layer on another portion of the first inorganic barrier layer corresponding to the display area.

In some embodiments, the step of forming a first organic material layer on a portion of the first inorganic barrier layer corresponding to the transition area includes: forming the first organic material layer by inkjet printing.

In some embodiments, the first organic material layer includes a first organic layer and a second organic layer, the first organic layer is disposed in the first undercut area, and the second organic layer is disposed in the second undercut area, and the first organic layer and the second organic layer are not connected to each other.

In some embodiments, a material of the first organic material layer includes an organic material and a water absorbing material and/or a water blocking material dispersed in the organic material.

In some embodiments, the water-absorbing material includes at least one of calcium oxide or silica gel, and the water blocking material includes at least one of silicon oxide, silicon nitride, or silicon oxynitride.

In some embodiments, in the first organic material layer, the water absorbing material and/or the water blocking material has a mass percentage of 0.1 wt % to 30 wt %.

In some embodiments, each of a particle size of the water absorbing material and a particle size of the water blocking material ranges from 10 nm to 10 μm.

In some embodiments, at least one second groove is defined on the substrate in the transition area, and the second groove is arranged at a side of one of the at least one retaining wall closest to the display area facing the display area, and one end of the second groove close to a bottom of the second groove includes a third undercut area extending toward the display area and a fourth undercut area extending toward the functional area; and before, after, or at the same time as the step of forming the display functional layer on the substrate, forming at least one retaining wall on the substrate in the transition area; and the retaining wall is arranged between one of the at least one first groove closest to the display area and one of the at least one second groove closest to the functional area.

In some embodiments, a material of each of the first inorganic barrier layer and the second inorganic barrier layer includes one or more of silicon oxide, silicon nitride, and silicon oxynitride.

In the display panel provided by the embodiments of the present application, by arranging the first organic material layer in the first undercut area and/or the second undercut area in the first groove, the first undercut area and/or the second undercut area can be filled with the first organic material layer to prevent the second inorganic barrier layer from being directly deposited on the first inorganic barrier layer on the inner surface of the first undercut area and/or the second undercut area, so that the first inorganic barrier layer and the second inorganic barrier layer are prevented from being stacked on the bent inner surface of the first undercut area and/or the second undercut area, which may result in stress concentration and easy fracture. Therefore, compared with the existing display panel, the display panel of an embodiment of the present application is less prone to the fracture of the inorganic barrier layer at the first groove, thereby having better encapsulation reliability, and a longer product service life.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

FIG. 4 is a flowchart of a method of manufacturing a display panel according to an embodiment of the present application.

DETAILED DESCRIPTION OF PREFERRED EMBODIMENTS

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

Figure 1:
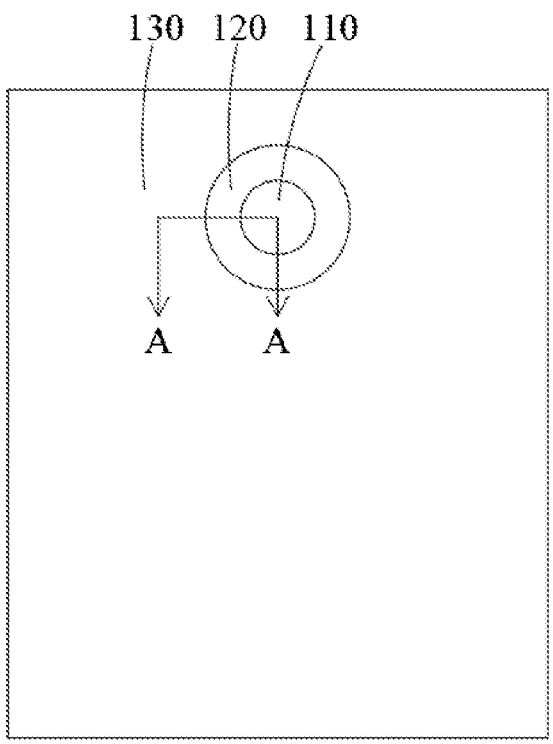
FIG. 1 is a schematic top view of a display panel according to an embodiment of the present application.
Figure 2:
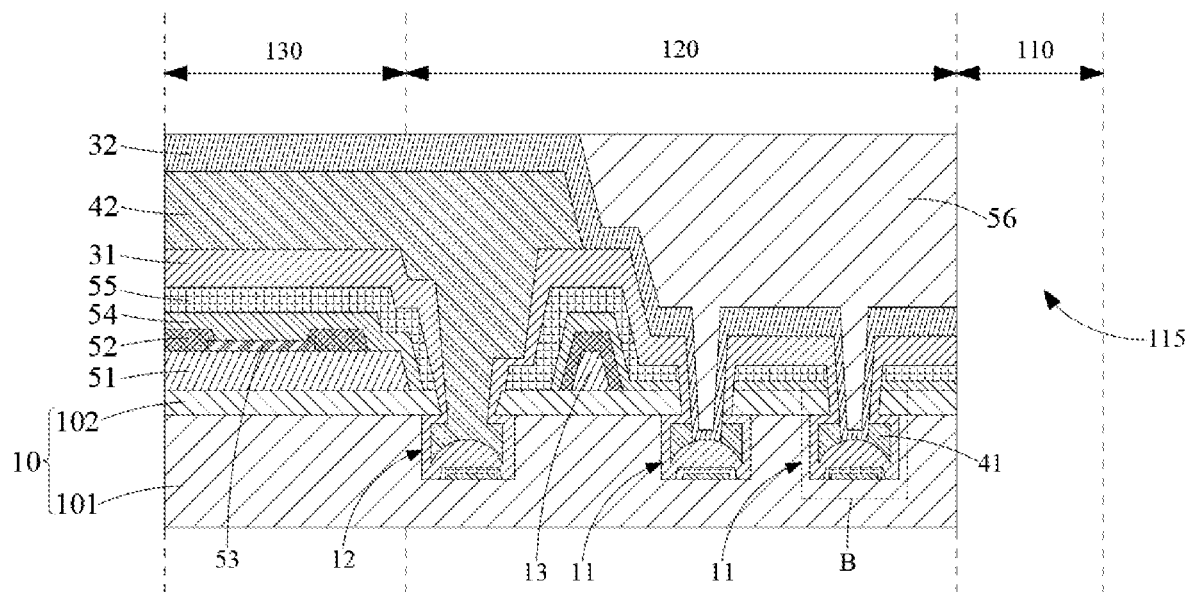
FIG. 2 is a schematic cross-sectional view of the display panel taken along the line A-A of FIG. 1.
Figure 3:
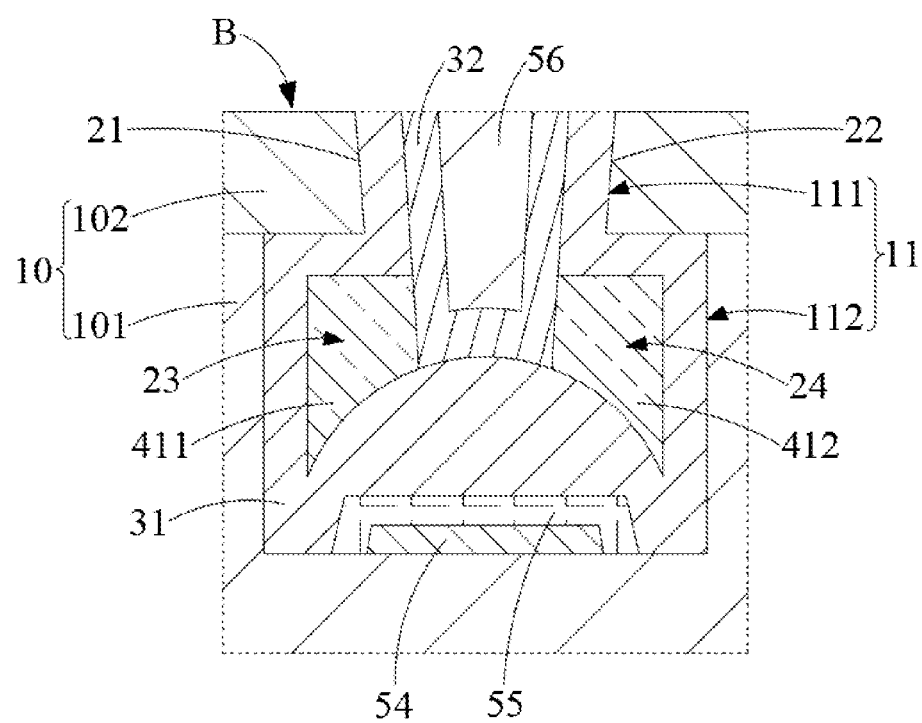
FIG. 3 is an enlarged schematic view of the area B in FIG. 2.

Referring to FIGS. 1 to 3, FIG. 1 is a schematic top view of a display panel according to an embodiment of the present application; FIG. 2 is a schematic cross-sectional view of the display panel taken along the line A-A of FIG. 1; and FIG. 3 is an enlarged schematic view of area B in FIG. 2. An embodiment of the present application provides a display panel 100, which includes a functional area 110, a transition area 120 defined at the periphery of the functional area 110, and a display area 130 defined at the periphery of the transition area 120.

The display panel 100 further includes a substrate 10. At least one first groove 11 is defined on the substrate 10 in the transition area 120, the first groove 11 includes a first portion 111 close to an opening of the first groove 11 and a second portion 112 close to a bottom of the first groove 11, the first portion 111 includes a first side 21 disposed close to the display area 130 and a second side 22 close to the functional area 110, the second portion 112 includes a first undercut area 23 extending from the first side 21 toward the display area 130 and a second undercut area 24 extending from the second side 22 toward the functional area 110. A first inorganic barrier layer 31, a first organic material layer 41, and a second inorganic barrier layer 32 are stacked in the first groove 11 in sequence, wherein the first inorganic barrier layer 31 covers a sidewall and the bottom of the first groove 11, the first organic material layer 41 is distributed in at least one of the first undercut area 23 or the second undercut area 24, and the second inorganic barrier layer 32 covers the first organic material layer 41 and the first inorganic barrier layer 31.

Exemplarily, openings 115 may be provided in the functional area 110 of the display panel 100, and functional elements such as cameras, earpieces, and various sensors may be arranged in the openings 115 to implement functions such as an off-screen camera and off-screen fingerprints.

It should be noted that the transition area 120 is defined to achieve a smooth transition from the functional area 110 to the display area 130 to reduce an influence of the functional area 110 on the display area 130. By arranging the first groove 11 in the transition area 120, the first groove 11 can be used to cut off the OLED light-emitting material layer, thereby blocking the water and oxygen intrusion channel, and improving the encapsulation reliability of the display panel 100.

In the embodiments of this application, at least one refers to one or more, and multiple refers to two or more, for example, three, four, five, six, seven, eight, and so on.

As shown in FIG. 2, a plurality of first grooves 11 may be provided on the substrate 10 in the transition area 120, and the plurality of first grooves 11 are sequentially arranged at intervals from the functional area 110 to the display area 130. Exemplarily, the plurality of first grooves 11 may all be ring-shaped, that is, the plurality of first grooves 11 may be arranged in nested concentric rings. In other embodiments, the first groove 11 may also be provided on the substrate 10 in the transition area 120.

Referring to FIG. 2 and FIG. 3, the substrate 10 may include a flexible film 101 and an inorganic film 102 which are stacked, wherein the first portion 111 of the first groove 11 may be disposed on the inorganic film 102, and the second portion 112 of the first groove 11 may be disposed on the flexible film 101. It is appreciated that the substrate 10 may also include more flexible films 101 and inorganic films 102 to form a structure in which multiple flexible films 101 and inorganic films 102 are alternately stacked. Exemplarily, a material of the flexible film 101 may be polyimide (PI), and a material of the inorganic film 102 may be silicon oxide (SiOx), wherein the inorganic film 102 may play a role of blocking water and oxygen.

Exemplarily, a material of each of the first inorganic barrier layer 31 and the second inorganic barrier layer 32 may include one or more of silicon oxide (SiOx), silicon nitride (SiNx), and silicon oxynitride (SiOxNy). It is appreciated that, both the first inorganic barrier layer 31 and the second inorganic barrier layer 32 can play the role of blocking water vapor and oxygen.

In the display panel 100 provided by the embodiment of the present application, the first organic material layer 41 is disposed in the first undercut area 23 and/or the second undercut area 24 in the first groove 11, so that the first organic material layer 41 can be used to fill the first undercut area 23 and/or the second undercut area 24 to prevent direct deposition of the second inorganic barrier layer 32 on the inorganic barrier layer 31 on an inner surface of the first undercut area 23 and/or the first undercut area 24. As such, the first inorganic barrier layer 31 and the second inorganic barrier layer 32 are prevented from being stacked on the bent inner surface of the first undercut area 23 and/or the second undercut area 24, which may result in stress concentration and easy fracture. Therefore, compared with the existing display panel, the display panel 100 of the embodiment of the present application is less likely to cause the fracture of the inorganic barrier layer at the first groove 11, and has better encapsulation reliability, and a longer product service life.

Referring to FIG. 3, the first organic material layer 41 includes a first organic layer 411 and a second organic layer 412, the first organic layer 411 is disposed in the first undercut area 23, the second organic layer 412 is disposed in the second undercut area 24, and the first organic layer 411 and the second organic layer 412 are not connected to each other.

Referring to FIG. 2 and FIG. 3, it can be seen that a portion of the first inorganic barrier layer 31 located at the bottom of the first groove 11 is convex. It is appreciated that, in the case where the portion of the first inorganic barrier layer 31 located at the bottom of the first groove 11 is convex, the first organic layer 411 and the second organic layer 412 are more likely to be separated in the process of inkjet printing, so that the inks for preparing the first organic layer 411 and the second organic layer 412 are not connected to each other.

It should be noted that, in the embodiment of the present application, by disposing the first organic layer 411 in the first undercut area 23 and disposing the second organic layer 412 in the second undercut area 24, the first organic layer 411 and the second organic layer 412 can be used to fill the first undercut area 23 and the second undercut area 24, respectively. When both the first undercut area 23 and the second undercut area 24 are filled, the first inorganic barrier layer 31 and the second inorganic barrier layer 32 are not stacked on the inner surface of each of the first undercut area 23 and the second undercut area 24. As such, the first inorganic barrier layer and the second inorganic barrier layer are prevented from being stacked on the bent inner surface of the first undercut area 23 and/or the second undercut area 24, which may otherwise result in stress concentration and easy fracture, thus improving the encapsulation reliability of the display panel 100. In addition, since the organic material has a weak ability to block water and oxygen, the first organic layer 411 and the second organic layer 412 are designed to be disconnected in the embodiment of the present application, that is, the first organic layer 411 and the second organic layer are separated from each other, so that the first organic layer 411 and the second organic layer 412 are prevented from connecting to form a water and oxygen intrusion channel, so as to ensure the encapsulation reliability of the display panel 100.

Exemplarily, the material of the first organic material layer 41 includes an organic material and a water-absorbing material and/or a water-blocking material dispersed in the organic material. Exemplarily, the organic material may include one or more of acrylic resin, polyacrylate, polycarbonate, epoxy resin. Exemplarily, the water-absorbing material includes at least one of calcium oxide and silica gel, and the water-blocking material includes at least one of silicon oxide, silicon nitride, and silicon oxynitride.

Exemplarily, in the first organic material layer 41, the mass percentage of the water absorbing material and/or the water blocking material may be 0.1 wt % to 30 wt %, for example, 0.1 wt %, 0.5 wt %, 1 wt %, 5 wt %, 10 wt %, 15 wt %, 20 wt %, 25 wt %, 30 wt %, etc. That is to say, when the first organic material layer 41 only contains the water absorbing material, the mass percentage of the water absorbing material is 0.1 wt % to 30 wt %; when the first organic material layer 41 only contains the water blocking material, the mass percentage of the water blocking material is 0.1 wt %-30 wt %; and when the first organic material layer 41 contains both the water-absorbing material and the water-blocking material, a sum of the mass percentage of the water-absorbing material and the mass percentage of the water-blocking material is 0.1 wt % to 30 wt %. Exemplarily, when the first organic material layer 41 contains both the water-absorbing material and the water-blocking material, the mass ratio of the water-absorbing material and the water-blocking material may be (1-5):(1-5), for example, 1:5, 1:4, 1:3, 1:2, 1:1, 5:1, 4:1, 3:1, 2:1, etc.

Exemplarily, a particle size of each of the water-absorbing material and the water-blocking material ranges from 10 nm to 10 μm, such as 10 nm, 30 nm, 50 nm, 70 nm, 100 nm, 200 nm, 50 nm, 800 nm, 1 μm, 3 μm, 5 μm, 7 μm, 10 μm, etc.

It should be noted that, when the water-absorbing material is provided in the first organic material layer 41 and the second inorganic barrier layer 32 is ruptured, the water-absorbing material can absorb the water vapor entering from the fracture of the second inorganic barrier layer 32. Since the moisture can be stored in the water-absorbing material (for example, when the water-absorbing material is calcium oxide, the calcium oxide can absorb water and then become calcium hydroxide), the invasion of water vapor can be delayed, thereby improving the encapsulation reliability of the product. When the water-blocking material is arranged in the first organic material layer 41 and the second inorganic barrier layer 32 is raptured, the water-blocking material can block the water vapor entering from the fracture of the second inorganic barrier layer 32. Since the water vapor is blocked at the outer side of the first organic material layer 41, the invasion of water vapor can be delayed, and the encapsulation reliability of the product can be improved.

Referring to FIG. 2, the display area 130 of the display panel 100 includes the substrate 10, the display functional layer 54, the first inorganic barrier layer 31, the second organic material layer 42 and the second inorganic barrier layer 32, which are stacked in sequence.

At least one retaining wall 13 is further provided on the substrate 10 in the transition area 120, and the retaining wall 13 is provided in the at least one first groove 11, and the retaining wall is arranged at a side of one of the at least one first groove 11 closest to the display area 130 facing the display area 130.

As shown in FIG. 2, one retaining wall 13 may be provided on the substrate 10 in the transition area 120. In other embodiments, a plurality of retaining walls 13 may also be provided on the substrate 10 in the transition area 120. The retaining walls 13 are arranged at intervals in the direction from the functional area 110 to the display area 130. Exemplarily, the plurality of retaining walls 13 may all be ring-shaped, that is, the plurality of retaining walls 13 may be arranged in nested concentric rings.

It should be noted that the function of the retaining wall 13 is that when the second organic material layer 42 is prepared in the display area 130 by inkjet printing, the retaining wall 13 can prevent the inkjet printing ink from overflowing.

Referring to FIG. 2, an area surrounded by the retaining wall 13 in the transition area 120 of the display panel 100 can be provided with a light-transmitting organic material 56, so that the upper surface of the transition area 120 of the display panel 100 is flush with the upper surface of the display area 130.

Exemplarily, the display functional layer 54 may include an OLED light-emitting material layer, an OLED cathode, and the like, which are stacked. In some embodiments, the display functional layer 54 may further include structural layers, such as a hole injection layer (HIL), a hole transport layer (HTL), an electron injection layer (EIL), an electron transport layer (ETL) and so on.

Referring to FIG. 2, the display area 130 of the display panel 100 may further include an OLED anode 53 and a pixel definition layer 52 disposed on the substrate 10. The pixel definition layer 52 is provided with an opening, and the OLED anode 53 is disposed at the bottom of the opening. The functional layer 54 covers the OLED anode 53.

Referring to FIG. 2, the display area 130 of the display panel 100 may further include a planarization layer 51 disposed between the substrate 10 and the OLED anode 53. Exemplarily, the retaining wall 13 and the planarization layer 51 may be formed in the same process, that is, the retaining wall 13 and the planarization layer 51 are made of the same material. Exemplarily, the retaining wall 13 and the planarization layer 51 are both organic materials.

Referring to FIG. 2, the display area 130 of the display panel 100 may further include a light extraction layer 55 disposed between the display functional layer 54 and the first inorganic barrier layer 31 to improve a light extraction rate of the OLED device.

Exemplarily, the display area 130 of the display panel 100 may further include an adhesive layer (not shown) disposed between the light extraction layer 55 and the first inorganic barrier layer 31, and a material of the adhesive layer may include lithium fluoride (LiF). It is appreciated that the adhesive layer can play a role in enhancing an adhesive force between the light extraction layer 55 and the first inorganic barrier layer 31.

Referring to FIG. 2, at least one second groove 12 is further provided on the substrate 10 in the transition area 120. When a retaining wall 13 is provided on the substrate 10 in the transition area 120, the second groove 12 is arranged at a side of one of the at least one retaining wall 13 facing the display area 130, one end of the second groove 12 close to a bottom of the second groove 12 includes a third undercut area extending toward the display area 130 and a fourth undercut area extending toward the functional area 110. That is, similar to the first groove 11, the second groove 12 also has an undercut structure. It is appreciated that the second groove 12 can also play the role of cutting off the OLED light-emitting material layer and cutting off the water vapor intrusion channel. When the first groove 11 located at the periphery of the second groove 12 fails to function as a barrier, the second groove 12 located closer to the display area 130 can block water and oxygen, so as to ensure the OLED device in the display area 130 not to be corroded by water and oxygen, which improves the reliability of encapsulation. In some embodiments, the first groove 11 and the second groove 12 are identical in shape and size.

It is appreciated that when the substrate 10 in the transition area 120 is provided with a plurality of retaining walls 13, the second groove 12 is arranged at a side of one of the at least one retaining wall 13 closest to the display area 130 facing the display area 130.

As shown in FIG. 2, one second groove 12 may be provided on the substrate 10 in the transition area 120. In other embodiments, a plurality of second grooves 12 may be provided on the substrate 10 in the transition area 120, the plurality of second grooves 12 are sequentially arranged at intervals in a direction from the functional area 110 to the display area 130. Exemplarily, the plurality of second grooves 12 may all be ring-shaped, that is, the plurality of second grooves 12 may be arranged in nested concentric rings.

Referring to FIG. 2 and FIG. 3, it can be seen that when the second groove 12 is provided on the substrate 10 in the transition area 120, the second organic material layer 42 will extend into the second groove 12, so that the second groove 12 is filled with organic materials, which is because when the second organic material layer 42 is fabricated by inkjet printing etc., the ink of the second organic material layer 42 will be cast into the second groove 12, that is, the second groove 12 can play a role in preventing the overflow of the inkjet printing ink to a certain extent.

Exemplarily, each of the first groove 11, the second groove 12, and the retaining wall 13 can be a closed structure connected end to end with an uninterrupted middle. The shapes of the first groove 11, the second groove 12, and the retaining wall 13 are, for example can be circular, oval, rectangular, square, star, irregular, etc.

Exemplarily, in the display area 130 of the display panel 100, inorganic barrier layers and organic material layers may be alternately stacked above the second inorganic barrier layer 32 to further improve the encapsulation effect on the display area 130. Exemplarily, in the transition area 120 of the display panel 100, a plurality of inorganic barrier layers may be disposed above the second inorganic barrier layer 32 to further enhance the water and oxygen barrier function of the transition area 120.

Figure 5:
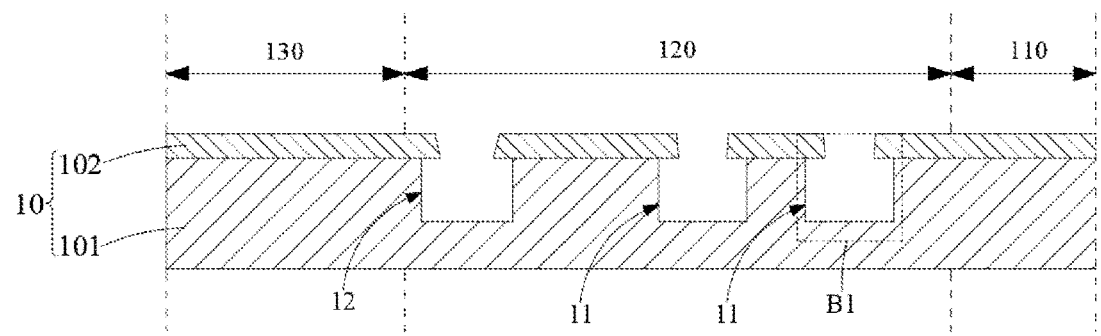
FIG. 5 is a schematic structural diagram of a substrate according to an embodiment of the present application.
Figure 6:
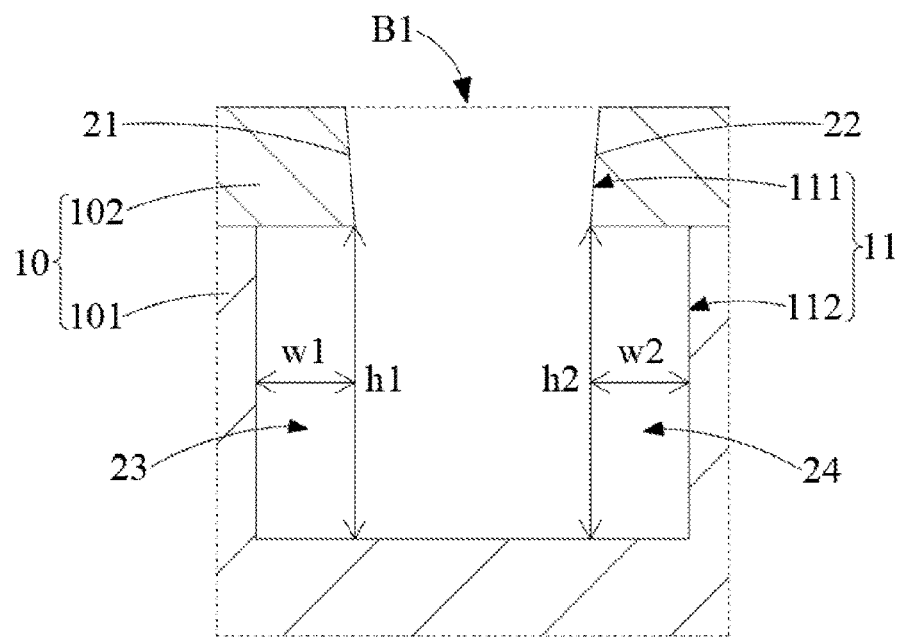
FIG. 6 is an enlarged schematic view of the area B1 in FIG. 5.

Referring to FIG. 4, FIG. 4 is a flowchart of a method of manufacturing a display panel according to an embodiment of the present application. Embodiments of the present application provide a method of manufacturing a display panel, including:

S100, referring to FIGS. 5 and 6, providing a substrate 10, wherein the substrate 10 includes a functional area 110, a transition area 120 defined at a periphery of the functional area 110, and a display area 130 defined at a periphery of the transition area 120; at least one first groove 11 is defined on the substrate 10 in the transition area 120, the first groove 11 includes a first portion 111 close to an opening of the first groove 11 and a second portion 112 close to a bottom of the first groove 11, the first portion 111 includes a first side 21 disposed close to the display area 130 and a second side 22 close to the functional area 110, the second portion 112 includes a first undercut area 23 extending from the first side 21 toward the display area 130 and a second undercut area 24 extending from the second side 22 toward the functional area 110.

Referring to FIG. 5 and FIG. 6, at least one second groove 12 is further provided on the substrate 10 in the transition area 120, and the second groove 12 is provided at a side of one of the at least one first groove 11 closest to the display area 130 and facing the display area 130, and one end of the second groove 12 close to a bottom of the second groove 12 includes a third undercut area extending toward the display area 130 and a fourth undercut area extending toward the functional area 110.

Referring to FIG. 6, each of a depth w1 of the first undercut area 23 and a depth w2 of the second undercut area 24 may be 1 μm to 2 μm, such as 1 μm, 1.2 μm, 1.5 μm, 1.7 μm, 2 μm, etc., and each of a height h1 of 23 of the first undercut area and a height h2 of the first undercut area 23 may be 1.5 μm to 2.5 μm, such as 1.2 μm, 1.5 μm, 1.7 μm, 2 μm, 2.2 μm, 2.5 μm, etc.

Figure 7:
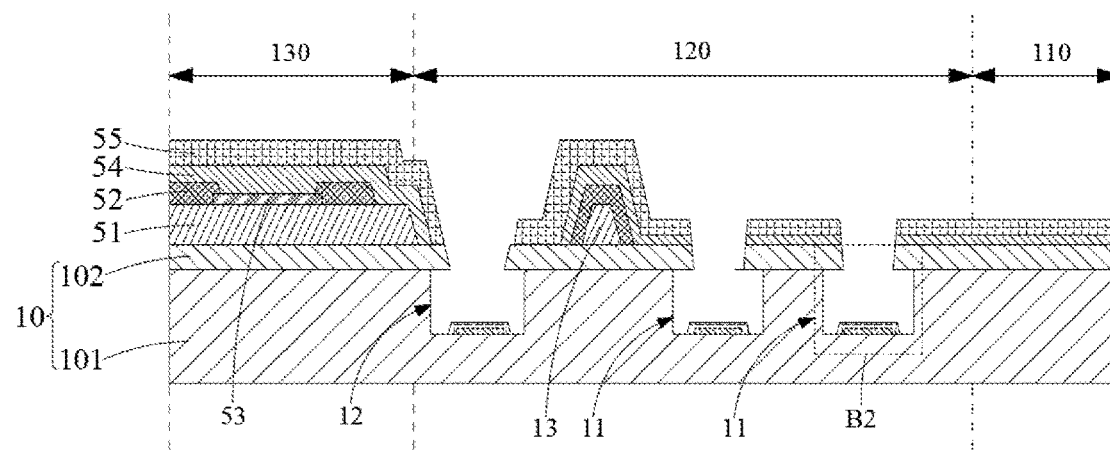
FIG. 7 is a schematic diagram of the display panel after disposing a display functional layer on a substrate according to an embodiment of the present application.
Figure 8:
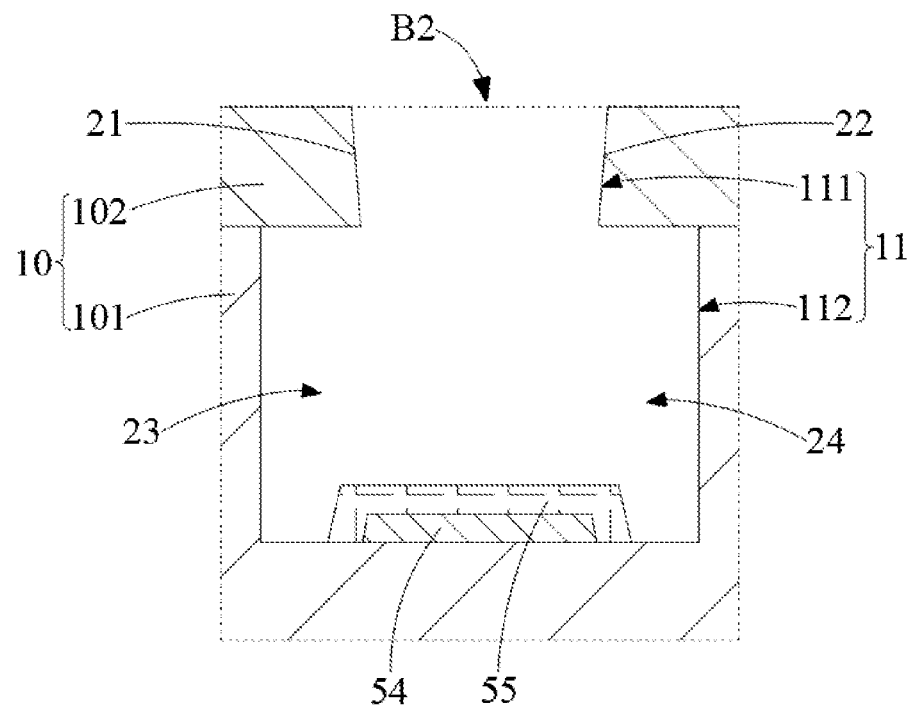
FIG. 8 is an enlarged schematic view of the area B2 in FIG. 7.

S200, referring to FIGS. 7 and 8, forming a display functional layer 54 on the substrate 10.

Exemplarily, the display functional layer 54 may include an OLED light-emitting material layer, an OLED cathode, and the like, which are stacked.

Referring to FIG. 7 and FIG. 8, it can be seen that since the bottoms of the first grooves 11 and the second grooves 12 have undercut structures, positions of the display functional layer 54 at the first grooves 11 and the second grooves 12 are disconnected, that is, the part of the display functional layer 54 located in the first groove 11 is not connected to the part of the display functional layer 54 located outside the first groove 11, and the part of the display functional layer 54 located in the second groove 12 is not connected to the part of the display functional layer 54 outside the second groove 12, so as to realize the isolation of the OLED light-emitting material layer and block the intrusion channel of water and oxygen.

Referring to FIG. 7, before disposing the display functional layer 54 on the substrate 10, an OLED anode 53 and a pixel definition layer 52 may be disposed in sequence on the substrate 10, the pixel definition layer 52 is provided with an opening, and the OLED anode 53 is disposed at the bottom of the opening, and the display functional layer 54 covers the OLED anode 53.

Referring to FIG. 7, before disposing the OLED anode 53 on the display area 130 of the substrate 10, a planarization layer 51 may also be disposed on the substrate 10, and both the OLED anode 53 and the pixel definition layer 52 are disposed on the planarization layer 51.

Referring to FIG. 7, before, after, or at the same time as the step of forming the display functional layer 54 on the substrate 10, forming at least one retaining wall 13 on the substrate 10 in the transition area 120; and the retaining wall 13 is arranged between one of the at least one first groove 11 closest to the display area 130 and one of the at least one second groove 12 closest to the functional area 110.

Exemplarily, the retaining wall 13 and the planarization layer 51 can be formed in the same process, that is, the retaining wall 13 and the planarization layer 51 are made of the same material (e.g., organic material).

Referring to FIG. 7 and FIG. 8, after the display functional layer 54 is provided on the substrate 10, a light extraction layer 55 may also be provided on the display functional layer 54 to improve the light extraction rate of the OLED device.

Exemplarily, after the light extraction layer 55 is disposed on the display functional layer 54, an adhesive layer (not shown) may also be disposed on the light extraction layer 55 to enhance the adhesion between the light extraction layer 55 and the first inorganic barrier layer 31. The material of the adhesive layer may include lithium fluoride (LiF).

Figure 9:
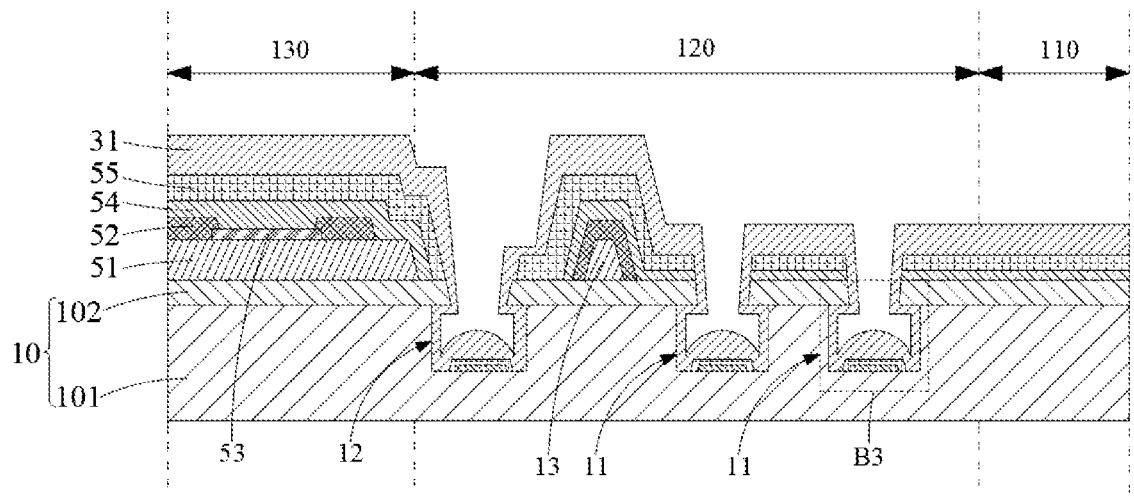
FIG. 9 is a schematic diagram of the display panel after disposing a first inorganic barrier layer on a substrate and a display functional layer according to an embodiment of the present application.
Figure 10:
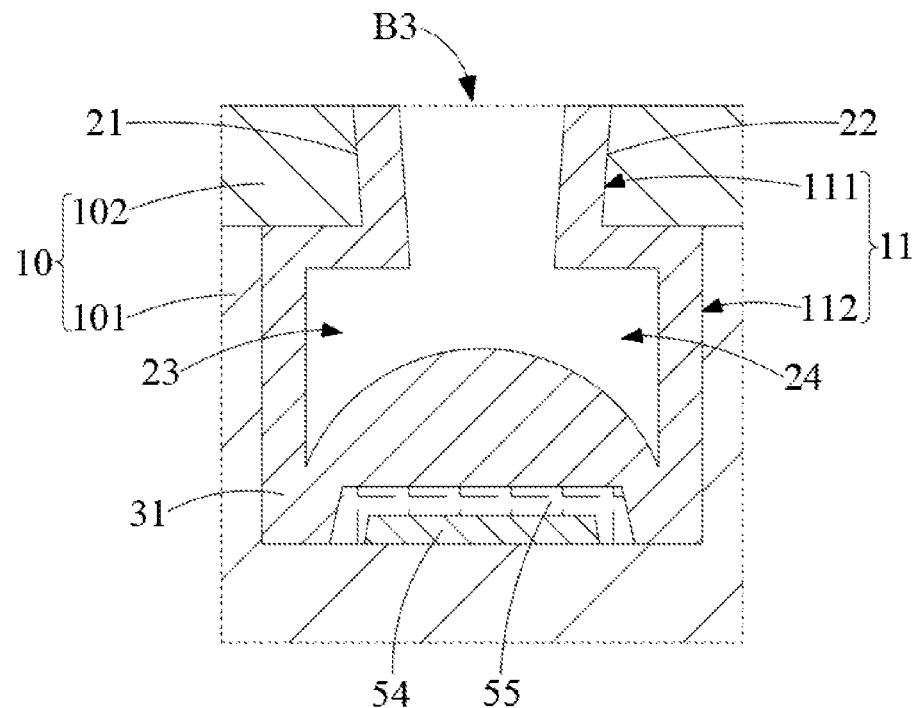
FIG. 10 is an enlarged schematic view of the area B3 in FIG. 9.

S300, referring to FIGS. 9 and 10, forming a first inorganic barrier layer 31 on the substrate 10 and the display functional layer 54, wherein the first inorganic barrier layer 31 covers a sidewall and the bottom of the first groove 11.

Referring to FIG. 9 and FIG. 10, when the bottom of the first groove 11 is provided with structural layers such as the display functional layer 54, the light extraction layer 55, the adhesive layer and the like, the first inorganic barrier layer 31 covers the parts of the structural layers such as the display functional layer 54, the extraction layer 55 and the adhesive layer located in the first groove 11.

Exemplarily, the first inorganic barrier layer 31 may be formed by using plasma enhanced chemical vapor deposition (PECVD) or atomic layer deposition (ALD). Referring to FIG. 9 and FIG. 10, it can be seen that since the material is affected by the topography of the first undercut area 23 and the second undercut area 24 during the deposition process, a portion of the first inorganic barrier layer 31 located at the bottom of the first groove 11 is convex.

Figure 11:
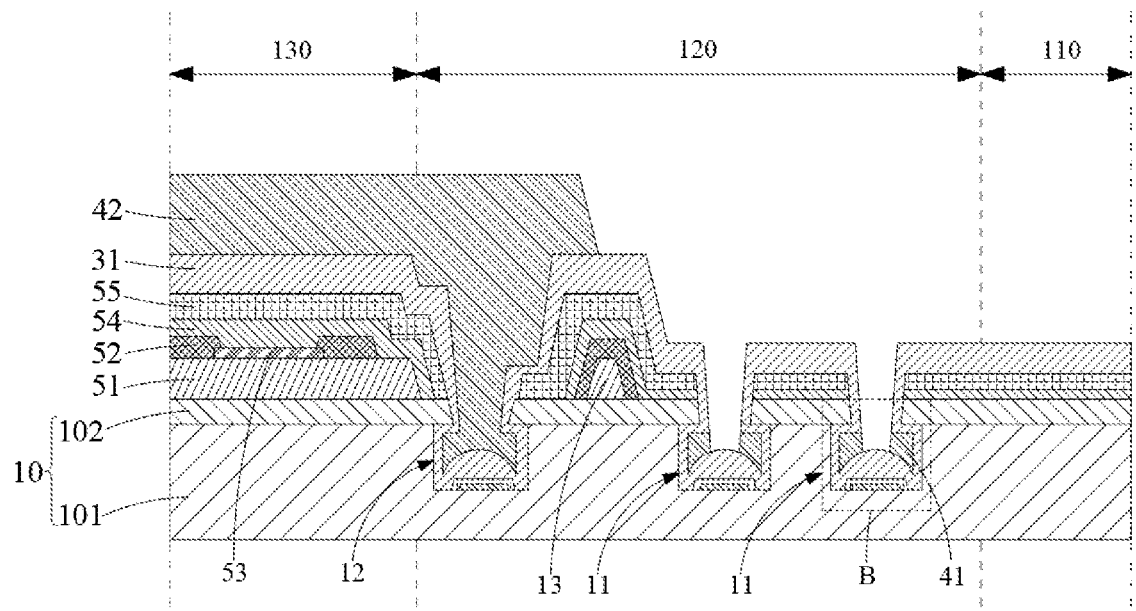
FIG. 11 is a schematic diagram of the display panel after disposing a first organic material layer on a portion of the first inorganic barrier layer located in the first groove according to an embodiment of the present application.
Figure 12:
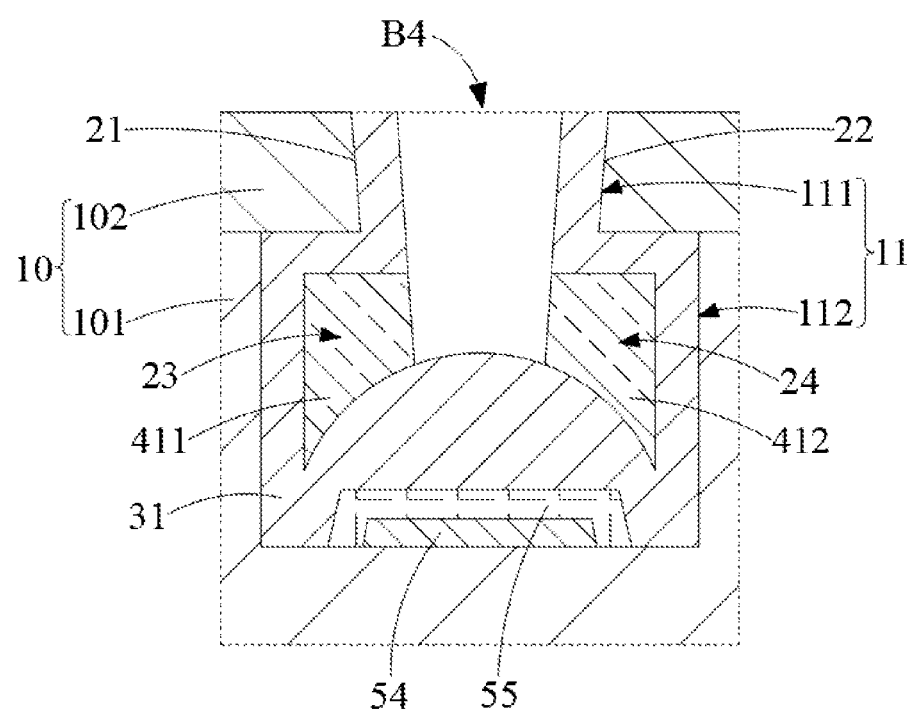
FIG. 12 is an enlarged schematic view of the area B4 in FIG. 11.

S400, referring to FIGS. 11 and 12, a first organic material layer 41 is disposed on the portion of the first inorganic barrier layer 31 located in the first groove 11, and the first organic material layer 41 is distributed in at least one of the first undercut area 23 and the second undercut area 24.

Referring to FIG. 11 and FIG. 12, the first organic material layer 41 includes a first organic layer 411 and a second organic layer 412, the first organic layer 411 is disposed on the first undercut area 23, and the second organic layer 412 is disposed on the second organic layer 411. The undercut area 24, and the first organic layer 411 and the second organic layer 412 are not connected.

Referring to FIG. 12, it can be seen that in the case where the portion of the first inorganic barrier layer 31 located at the bottom of the first groove 11 is convex, the first organic layer 411 and the second organic layer 412 are more easily separated.

Exemplarily, the material of the first organic material layer 41 includes an organic material and a water-absorbing material and/or a water-blocking material dispersed in the organic material.

Exemplarily, the water-absorbing material includes at least one of calcium oxide or silica gel, and the water-blocking material includes at least one of silicon oxide, silicon nitride, or silicon oxynitride.

Referring to FIG. 11, before, after or at the same time of disposing the first organic material layer 41 on the portion of the first inorganic barrier layer 31 corresponding to the transition area 120, the second organic material layer 42 is provided on the portion of the first inorganic barrier layer 31 corresponding to the display area 130. It is appreciated that the second organic material layer 42 can play a buffer role between the first inorganic barrier layer 31 and the second inorganic barrier layer 32 to improve the flexibility and impact resistance of the thin film encapsulation layer. When the second groove 12 is further provided on the substrate 10 in the transition area 120, when the second organic material layer 42 is fabricated by methods such as inkjet printing, the ink of the second organic material layer 42 will be cast to the second groove 12, that is to say, the second groove 12 can also play a role of preventing overflow to a certain extent.

Exemplarily, disposing the first organic material layer 41 on the portion of the first inorganic barrier layer 31 corresponding to the transition area 120 includes: disposing the first organic material layer 41 by using an inkjet printing method. It is appreciated that, since the placement site of the first organic material layer 41 needs to be precisely positioned to the first undercut area 23 and/or the second undercut area 24 of the first groove 11, it is necessary to use a high-precision inkjet. A printing device is used to achieve precise positioning of the first organic material layer 41.

Exemplarily, when the first organic material layer 41 is set by inkjet printing, a viscosity of the ink used can be controlled to be 20 cps-30 cps (for example, 20 cps, 22 cps, 25 cps, 28 cps, 30 cps, etc.), so that the ink has a higher liquidity.

S500, referring to FIG. 2 and FIG. 3, forming a second inorganic barrier layer 32 on the first organic material layer 41, wherein at the first groove 11, the second inorganic barrier layer 32 covers the first organic material layer 41 and the first inorganic barrier layer 31.

Exemplarily, the second inorganic barrier layer 32 may be formed by plasma enhanced chemical vapor deposition (PECVD) or atomic layer deposition (ALD).

Referring to FIG. 2, after forming the second inorganic barrier layer 32 on the first organic material layer 41, a light-transmitting organic material 56 may be arranged in an area surrounded by the retaining wall 13 on the obtained substrate, so that an upper surface of the obtained display panel 100 in the transition area 120 is flush with an upper surface of the obtained display panel 100 in the display area 130.

Referring to FIG. 2, after forming the second inorganic barrier layer 32, the obtained substrate in the functional area 110 may be drilled to form the opening 115. Exemplarily, the functional area 110 of the obtained substrate may be drilled by a process such as laser cutting.

Exemplarily, before drilling the obtained substrate in the functional area 110, structures such as touch electrodes, circular polarizers, etc. may also be arranged above the second inorganic barrier layer 32, and a structure such as a protective film may be arranged below the substrate 10.

The display panel and the manufacturing method thereof provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising a functional area, a transition area defined at a periphery of the functional area, and a display area defined at a periphery of the transition area;
wherein the display panel further comprises a substrate, at least one retaining wall is disposed on the substrate in the transition area, at least one first groove and at least one second groove are defined on the substrate in the transition area,
the first groove comprises a first portion close to an opening of the first groove and a second portion close to a bottom of the first groove, the first portion comprises a first side disposed close to the display area and a second side close to the functional area, the second portion comprises a first undercut area extending from the first side toward the display area and a second undercut area extending from the second side toward the functional area, a first inorganic barrier layer, a first organic material layer, and a second inorganic barrier layer are stacked in the first groove in sequence, wherein the first inorganic barrier layer covers a sidewall and the bottom of the first groove, the first organic material layer is distributed in at least one of the first undercut area or the second undercut area, and the second inorganic barrier layer covers the first organic material layer and the first inorganic barrier layer;

the retaining wall is arranged at a side of one of the at least one first groove closest to the display area facing the display area; and the second groove is arranged at a side of one of the at least one retaining wall closest to the display area facing the display area, and one end of the second groove close to a bottom of the second groove comprises a third undercut area extending toward the display area and a fourth undercut area extending toward the functional area.

2. The display panel according to claim 1, wherein the first organic material layer comprises a first organic layer and a second organic layer, the first organic layer is disposed in the first undercut area, and the second organic layer is disposed in the second undercut area, and the first organic layer and the second organic layer are not connected to each other.

3. The display panel according to claim 1, wherein a material of the first organic material layer comprises an organic material and a water absorbing material and/or a water blocking material dispersed in the organic material.

4. The display panel according to claim 3, wherein the water-absorbing material comprises at least one of calcium oxide or silica gel, and the water blocking material comprises at least one of silicon oxide, silicon nitride, or silicon oxynitride.

5. The display panel according to claim 3, wherein, in the first organic material layer, the water absorbing material and/or the water blocking material has a mass percentage of 0.1 wt % to 30 wt %.

6. The display panel according to claim 3, wherein each of a particle size of the water absorbing material and a particle size of the water blocking material ranges from 10 nm to 10 µm.

7. The display panel according to claim 1, wherein an organic material is provided in the second groove.

8. The display panel according to claim 1, wherein a material of each of the first inorganic barrier layer and the second inorganic barrier layer comprises one or more of silicon oxide, silicon nitride, and silicon oxynitride.

9. A method of manufacturing a display panel, comprising:

providing a substrate, wherein the substrate comprises a functional area, a transition area defined at a periphery of the functional area, and a display area defined at a periphery of the transition area; at least one first groove and at least one second groove are defined on the substrate in the transition area, the first groove comprises a first portion close to an opening of the first groove and a second portion close to a bottom of the first groove, the first portion comprises a first side disposed close to the display area and a second side close to the functional area, the second portion comprises a first undercut area extending from the first side toward the display area and a second undercut area extending from the second side toward the functional area, the second groove is arranged at a side of one of the at least one retaining wall closest to the display area facing the display area, and one end of the second groove close to a bottom of the second groove comprises a third undercut area extending toward the display area and a fourth undercut area extending toward the functional area;

forming a display functional layer on the substrate;

forming a first inorganic barrier layer on the substrate and the display functional layer, wherein the first inorganic barrier layer covers a sidewall and the bottom of the first groove;

forming a first organic material layer on a portion of the first inorganic barrier layer in the first groove, wherein the first organic material layer is distributed in at least one of the first undercut area or the second undercut area;

forming a second inorganic barrier layer on the first organic material layer, wherein at the first groove, the second inorganic barrier layer covers the first organic material layer and the first inorganic barrier layer; and before, after, or at the same time as the step of forming the display functional layer on the substrate, forming at least one retaining wall on the substrate in the transition area; and the retaining wall is arranged between one of the at least one first groove closest to the display area and one of the at least one second groove closest to the functional area.

10. The method of manufacturing a display panel according to claim 9, wherein before, after, or at the same time as the step of forming a first organic material layer on a portion of the first inorganic barrier layer corresponding to the transition area, the method further comprises forming a second organic material layer on another portion of the first inorganic barrier layer corresponding to the display area.

11. The method of manufacturing a display panel according to claim 9, wherein the step of forming a first organic material layer on a portion of the first inorganic barrier layer corresponding to the transition area comprises: forming the first organic material layer by inkjet printing.

12. The method of manufacturing a display panel according to claim 9, wherein the first organic material layer comprises a first organic layer and a second organic layer, the first organic layer is disposed in the first undercut area, and the second organic layer is disposed in the second undercut area, and the first organic layer and the second organic layer are not connected to each other.

13. The method of manufacturing a display panel according to claim 9, wherein a material of the first organic material layer comprises an organic material and a water absorbing material and/or a water blocking material dispersed in the organic material.

14. The method of manufacturing a display panel according to claim 13, wherein the water-absorbing material comprises at least one of calcium oxide or silica gel, and the water blocking material comprises at least one of silicon oxide, silicon nitride, or silicon oxynitride.

15. The method of manufacturing a display panel according to claim 13, wherein in the first organic material layer, the water absorbing material and/or the water blocking material has a mass percentage of 0.1 wt % to 30 wt %.

16. The method of manufacturing a display panel according to claim 13, wherein each of a particle size of the water absorbing material and a particle size of the water blocking material ranges from 10 nm to 10 µm.

17. The method of manufacturing a display panel according to claim 9, wherein a material of each of the first inorganic barrier layer and the second inorganic barrier layer comprises one or more of silicon oxide, silicon nitride, and silicon oxynitride.

* * * * *